United States Patent [19]

Dousen et al.

[11] Patent Number: 5,332,921
[45] Date of Patent: Jul. 26, 1994

[54] RESIN-SEAL TYPE SEMICONDUCTOR DEVICE

[75] Inventors: Noriaki Dousen; Nobuyuki Sato; Kouji Araki, all of Yokohama, Japan

[73] Assignee: Kabushiki Kaisha Toshiba, Kawasaki, Japan

[21] Appl. No.: 52,610

[22] Filed: Apr. 27, 1993

[30] Foreign Application Priority Data

Apr. 27, 1992 [JP] Japan .................. 4-107786

[51] Int. Cl.5 .......................................... H01L 23/02
[52] U.S. Cl. .................................. 257/685; 257/723; 257/787
[58] Field of Search ................ 257/685, 723, 787, 790

[56] References Cited

U.S. PATENT DOCUMENTS

4,862,322  8/1989  Bickford et al. .............. 257/723
5,083,189  1/1992  Sawaya ......................... 257/685
5,218,231  6/1993  Kudo ............................ 257/723

Primary Examiner—Rolf Hille
Assistant Examiner—Roy Potter
Attorney, Agent, or Firm—Oblon, Spivak, McClelland, Maier & Neustadt

[57] ABSTRACT

A resin-seal type semiconductor device includes a main substrate divided into first and second surfaces on which first and second insulating substrates are respectively provided. Circuit wiring patterns and first end portions of outer leads are provided on the first and second insulating substrates. Semiconductor elements are soldered onto the wiring patterns and coated with a surface protection material. The main substrate is then folded over so that the first and second surfaces oppose one another and the device acquires a U-shaped cross-section. A space formed between the first and second surfaces inside the U-shape is sealed with a resin such that second end portions of the outer leads are exposed from the resin.

23 Claims, 5 Drawing Sheets

RESIN-SEAL TYPE SEMICONDUCTOR DEVICE

BACKGROUND OF THE INVENTION

1. Field of the Invention

The present invention relates to a resin-seal type semiconductor device containing an insulating circuit substrate on which a semiconductor element is mounted.

2. Description of the Related Art

Figure 9:
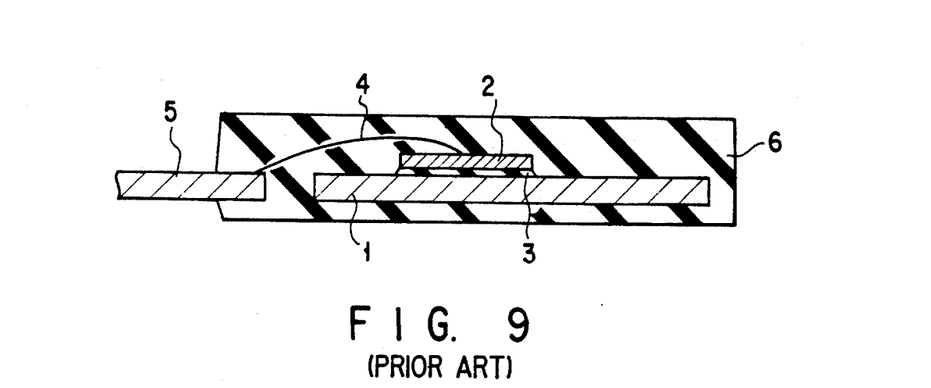
FIG. 9 is a cross-sectional view showing a conventional SIP-type resin-sealed semiconductor device.

FIG. 9 is a cross-sectional view showing a conventional SIP (Single-In-Line-Package) type resin-sealed semiconductor device.

A semiconductor element 2 is fixed on a metal lead frame 1 by means of solder 3. The semiconductor element is electrically connected to a first end portion of an outer lead 5 by a metal wire 4. The metal lead frame 1, semiconductor element 2 and the first end portion of the outer lead 5 are sealed with a resin 6 by a transfer molding process. A second end portion of the outer lead projects from the resin 6.

Figure 10:
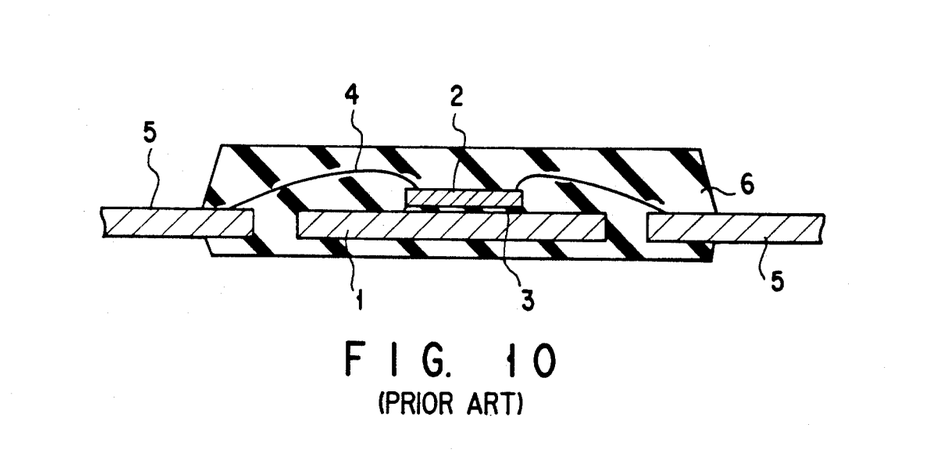
FIG. 10 is a cross-sectional view showing a conventional DIP-type resin-sealed semiconductor device.

FIG. 10 is a cross-sectional view showing a conventional DIP (Dual-In-Line-Package) type resin-sealed semiconductor device. The parts common to those shown in FIG. 9 are denoted by like reference numerals, and only different parts will be described.

Second end portions of outer leads 5, which are opposite to the first end portions thereof sealed with resin 6, are projected in two directions.

The SIP- and DIP-type resin-sealed semiconductor devices can be manufactured at low material cost in simple assembly steps, and these devices are suitable for mass-production.

In the above semiconductor devices, a radiation part situated under the metal lead frame 1 is also sealed with resin. Thus, compared to a semiconductor device having a radiation part formed of a ceramic material, the saturation heat resistance Rth (°C/W) of the above devices is higher. Consequently, in the conventional resin-seal type semiconductor devices, the power loss Pc(W) allowable to the resin or a casing is low.

In addition, in the case where two or more semiconductor elements are mounted in the conventional resin-seal type semiconductor device, it is very difficult to form wiring patterns connecting the semiconductor elements, since the lead frame cannot be made finer or thinner. Thus, two or more semiconductor elements cannot be mounted in the conventional resin-seal type semiconductor device. Consequently, the density of mounted semiconductor elements is not satisfactorily high in this semiconductor device.

SUMMARY OF THE INVENTION

The object of the present invention is to provide a resin-seal type semiconductor device having an improved density of mounted semiconductor elements, a lower saturation heat resistance, and a higher allowable power loss.

This object can be achieved by a resin-seal type semiconductor device comprising:

A substrate having a first surface and a second surface, which are opposed to each other, and a third surface connecting the first and second surfaces;

a first insulating substrate provided on the first surface of the substrate;

a second insulating substrate provided on the second surface of the substrate;

first and second semiconductor circuits provided on the first and second insulating substrates, the first and second semiconductor circuits being electrically connected to each other;

first and second outer leads having first end portions provided on the first and second insulating substrates, the first and second outer leads being electrically connected to the first and second semiconductor circuits; and a resin for sealing a gap between the first and second surfaces of the substrate, second end portions of the first and second outer leads being exposed from the resin.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENTS

Embodiments of the present invention will now be described with reference to the accompanying drawings.

Figure 1A:
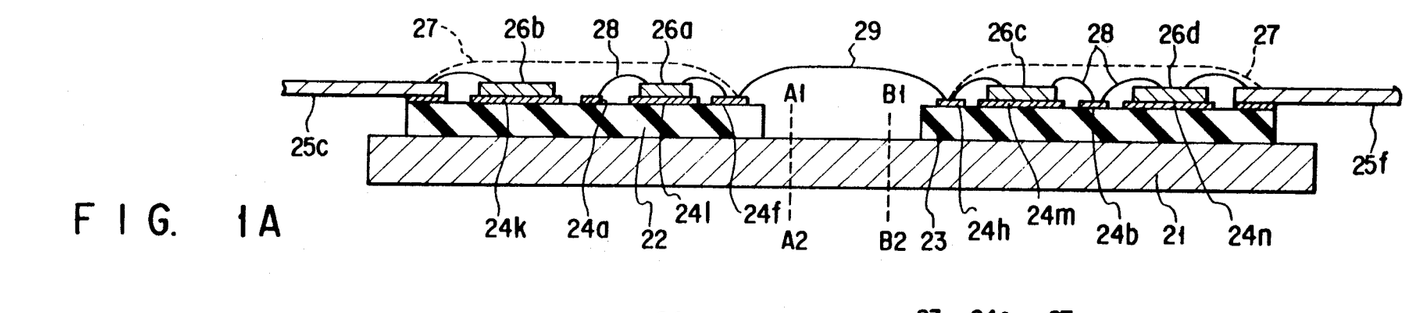
FIG. 1A is a cross-sectional view illustrating a method of manufacturing a resin-seal type semiconductor device according to a first embodiment of the present invention.
Figure 1B:
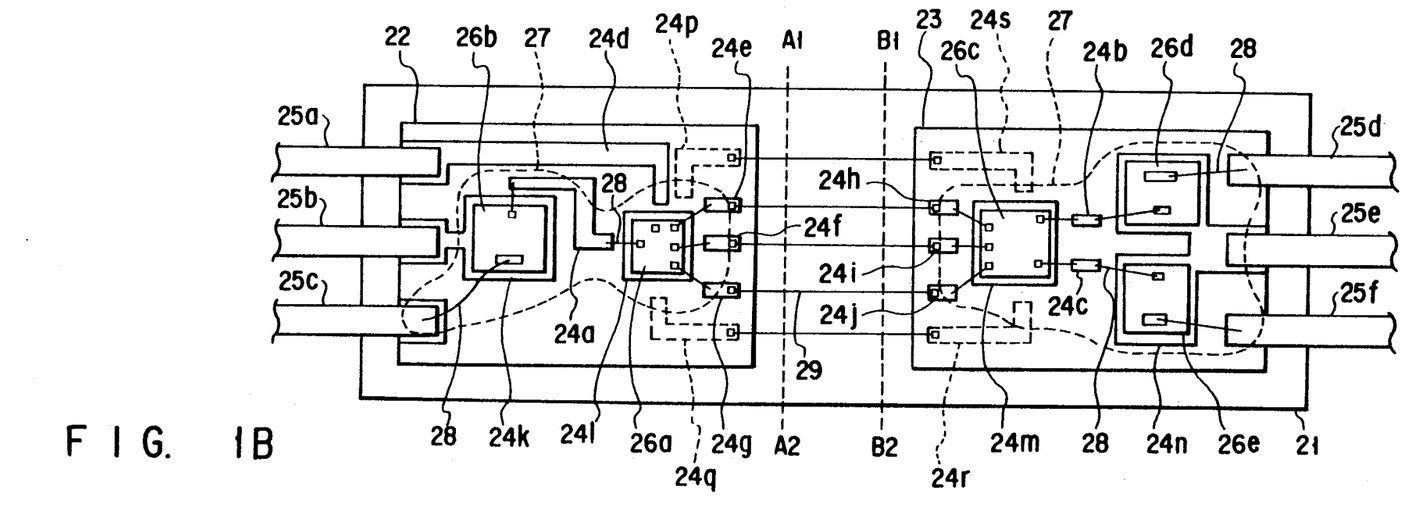
FIG. 1B is a plan view of the semiconductor device shown in FIG. 1A.
Figure 2:
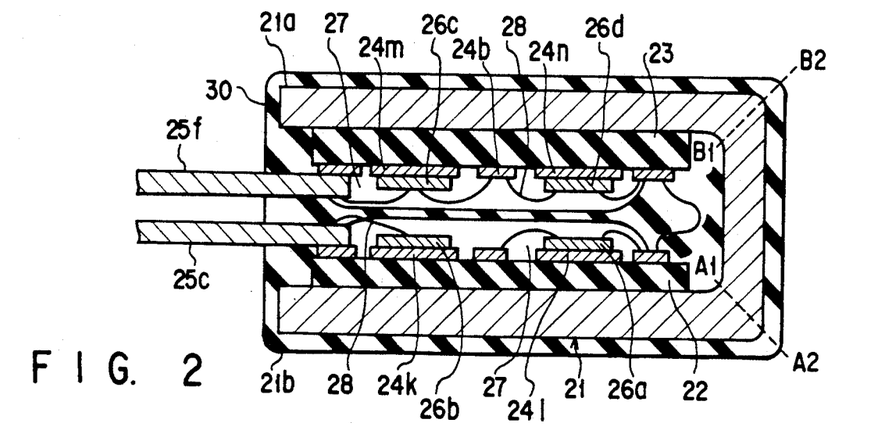
FIG. 2 illustrates the method of manufacturing the resin-seal type semiconductor device according to the first embodiment of the invention, and specifically shows a step following the step illustrated in FIG. 1A.

FIG. 1A, FIG. 1B and FIG. 2 illustrate a method of manufacturing a resin-seal type semiconductor device according to a first embodiment of the invention.

First and second insulating circuit substrates 22 and 23 are fixed on a metal plate 21 by means of solder or paste (not shown). Metal wiring patterns 24a to 24n and first end portions of outer leads 25a to 25f are provided on the first and second insulating circuit substrates 22 and 23. Semiconductor elements 26a to 26e are fixed on the wiring patterns 24k to 24n by means of solder (not shown).

Specifically, both end portions of the wiring patterns 24a to 24c are electrically connected to the semiconductor elements 26a to 26e by bonding wires 28 formed of a metal such as Au, Al or Cu. A first end portion of the wiring pattern 24d is electrically connected to the semiconductor element 26a by the bonding wire 28, and a second end portion of the wiring pattern 24d is electrically connected to a first end portion of the outer lead 25a by means of solder (not shown). The outer lead 25b is connected to a predetermined metal wiring pattern. Further, first end portions of the wiring patterns 24e to 24g provided on the first insulating circuit substrate 22 are electrically connected to the semiconductor element 26a by the bonding wires 28. Second end portions of the wiring patterns 24e to 24g are electrically connected to first end portions of metal wires 29 which are, for example, wires provided on a printed wiring plate formed of a heat-resistant flexible tape or wires bonded by welding. Second end portions of the metal wires 29 are electrically connected to first end portions of the wiring patterns 24h to 24j provided on the second insulating circuit substrate 23. Second end portions of the wiring patterns 24h to 24j are electrically connected to the semiconductor element 26c by the bonding wires 28. First end portions of the outer leads 25c, 25d and 25f are electrically connected to the semiconductor elements 26b, 26d and 26e by the bonding wires 28. The wiring patterns 24p to 24s serve as auxiliary wiring spaces.

Following the above steps, a surface protection material is coated on the surfaces of semiconductor elements 26a to 26e and metal wires 28.

Then, as shown in FIG. 2 the metal plate 21 is bent along bending lines A1-A2 and B1-B2, so as to have a U-shaped cross section. The second insulating circuit substrate 23 is situated on the inner surface of an upper portion 21a of the bent metal plate 21, and the first insulating circuit substrate 22 is situated on the inner surface of a lower portion 21b of the bent metal plate 21. In other words, the metal plate 21 is bent such that the first and second insulating circuit substrates 22 and 23 face each other.

Thereafter, the first and second insulating circuit substrates 22 and 23 and metal plate 21 are sealed with the resin 30 in a transfer molding process.

According to the first embodiment, the first and second insulating circuit substrates 22 and 23, on which the semiconductor elements 26a to 26e are mounted, are provided on the metal plate 21. Then, the metal plate 21 is bent such that the first and second insulating circuit substrates 22 and 23 face each other. Thereafter, the first and second insulating circuit substrates 22 and 23 and metal plate 21 are sealed with the resin 30 in the transfer molding process. In this manner, the semiconductor elements 26a to 26e are mounted on the two insulating circuit substrates 22 and 23. Thus, the density of mounted semiconductor elements in the resin-seal type semiconductor device can be increased.

Furthermore, in the resin-seal type semiconductor device, the metal plate 21 having a lower heat resistance than a resin material is formed to have a U-cross section. Thus, the saturation heat resistance of the resin-seal type semiconductor device can be made lower than that of a conventional device, and accordingly the allowable power loss can remarkably be increased. In addition, if the first and second insulating circuit substrates 22 and 23 are formed of a material with high radiation properties, e.g. a ceramic material such as $Al_2O_3$, AlN, or SiC, the allowable power loss can be further increased.

Moreover, in the resin-seal type semiconductor device, the area for mounting of semiconductor elements is reduced by forming the metal plate 21 so as to have a U-cross section. Thus, the stress due to resin sealing of the resin-seal type semiconductor device can be decreased. Thereby, cracks or warping of the insulating circuit substrates 22 and 23 can be prevented, and the reliability of the semiconductor device against repetitive temperature variations can be enhanced.

Figure 3:
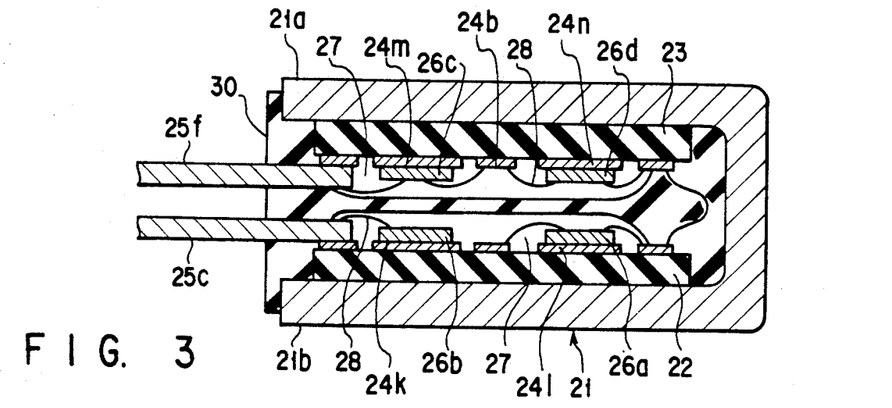
FIG. 3 is a cross-sectional view showing a resinseal type semiconductor device according to a second embodiment of the invention.

FIG. 3 is a cross-sectional view showing a resin-seal type semiconductor device according to a second embodiment of the invention. The parts common to those shown in FIG. 2 are denoted by like reference numerals, and only different parts will be described.

The inner surface of the metal plate 21 bent in a U-shape and the first and second insulating circuit substrates 22 and 23 are sealed with the resin 30. The outer surface of the metal plate 21 is exposed.

The same advantage as in the first embodiment can be obtained by the second embodiment. In addition, since the outer surface of the metal plate 21 is exposed, the radiation properties of the resin-seal type semiconductor device can remarkably be enhanced. Specifically, the saturation heat resistance of the resin-seal type semiconductor device can be decreased to $\frac{1}{2}$ or less of the conventional device.

Figure 4:
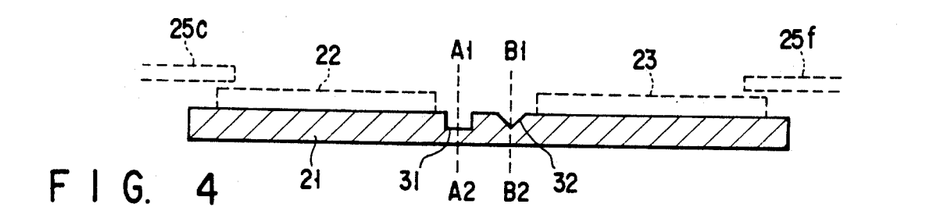
FIG. 4 is a cross-sectional view showing a resin-seal type semiconductor device according to a third embodiment of the invention.

FIG. 4 shows a metal plate in a resin-seal type semiconductor device according to a third embodiment of the invention. The parts common to those shown in FIG. 1A are denoted by like reference numerals, and only different parts will be described.

The metal plate 21 is provided with a first groove 31 extending along a bending line A1-A2 and a second groove 32 extending along a bending line B1-B2. The cross-sectional shape of the first groove 31 is rectangular, and that of the second groove 32 is triangular.

The same advantage as in the first embodiment can be obtained by the third embodiment. In addition, since first and second grooves 31 and 32 are formed along the bending lines, the metal plate 21 can easily be bent along the bending lines.

Although the first and second grooves 31 and 32 have rectangular and triangular cross sections, respectively, they may have other cross-sectional shapes.

Figure 5:
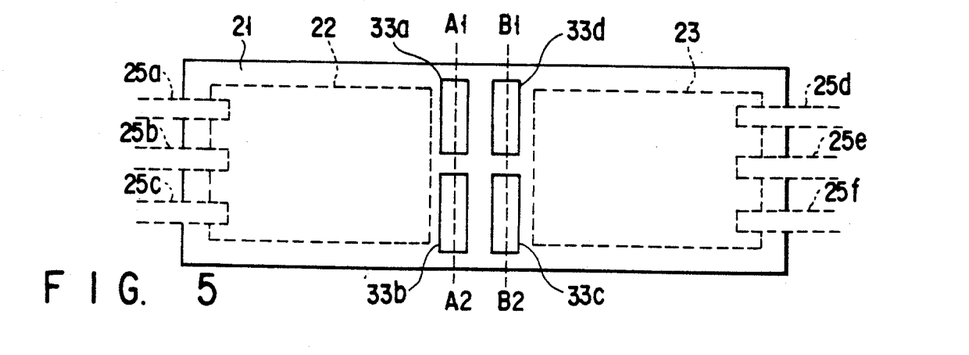
FIG. 5 is a plan view showing a resin-seal type semiconductor device according to a fourth embodiment of the invention.

FIG. 5 shows a metal plate in a resin-seal type semiconductor device according to a fourth embodiment of the invention. The parts common to those shown in FIG. 1B are denoted by like reference numerals, and only different parts will be described.

Holes 33a to 33d are formed in the metal plate 21 along bending lines A1-A2 and B1-B2.

The same advantage as in the third embodiment can be obtained by the fourth embodiment.

Figure 6:
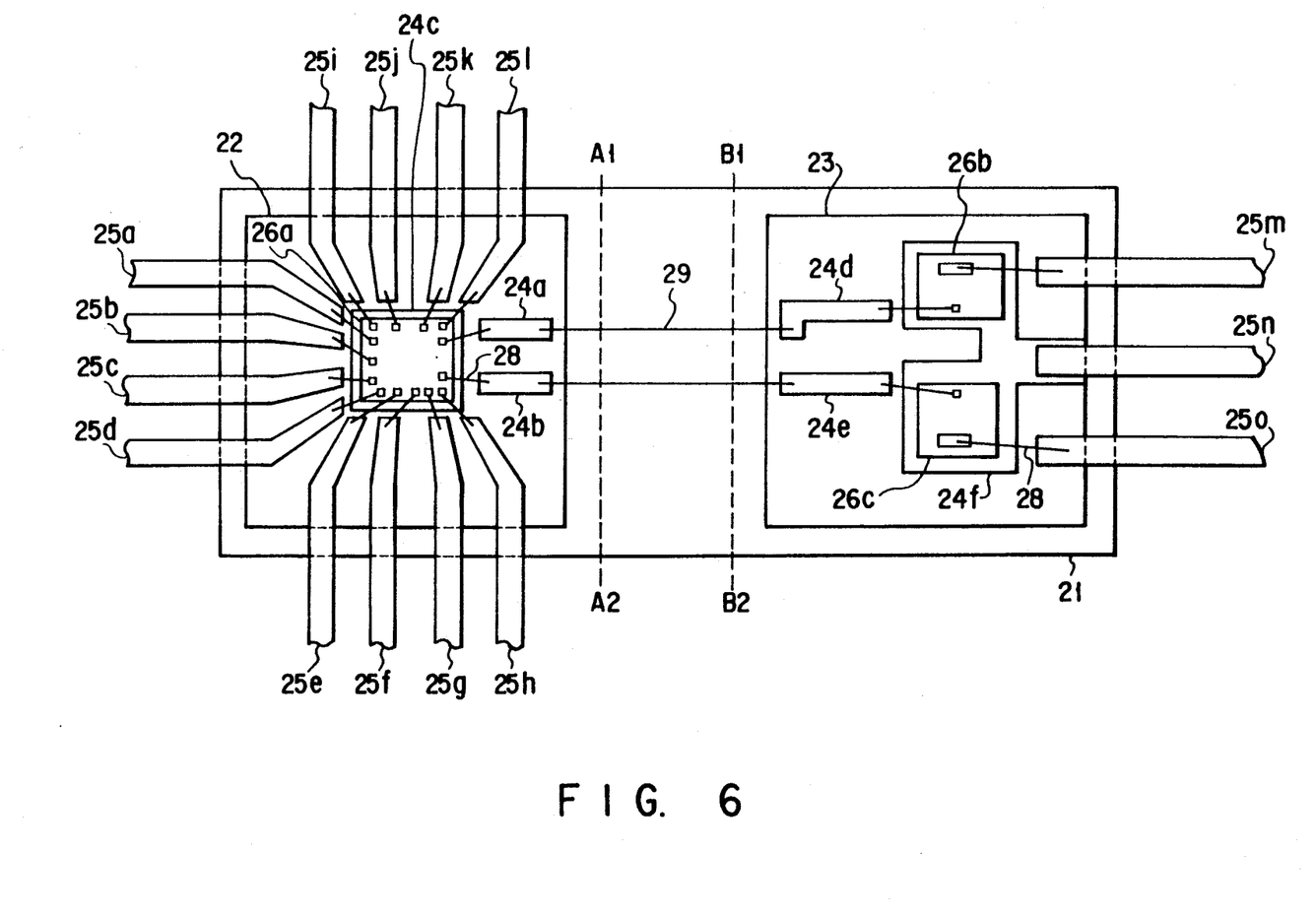
FIG. 6 is a plan view illustrating a manufacturing step of a resin-seal type semiconductor device according to a fifth embodiment of the invention.

FIG. 6 is a plan view illustrating a manufacturing step of a resin-seal type semiconductor device according to a fifth embodiment of the invention. The parts common to those shown in FIG. 1B are denoted by like reference numerals, and only different parts will be described.

Metal wiring patterns 24a to 42c and first end portions of leads 25a to 25l are provided on the first insulating circuit substrate 22. Second end portions of the leads 25a to 25l project from the first insulating circuit substrate 22 in three directions. Metal wiring patterns 24d to 42f and first end portions of leads 25m and 25o are provided on the second insulating circuit substrate 23. Semiconductor elements 26a to 26c are fixed on the wiring patterns 24c and 24f by means of solder (not shown).

The same advantage as in the first embodiment can be obtained by the fifth embodiment. In addition, since the second end portions of the leads 25a to 25l are projected from the first insulating circuit substrate 22 in three directions, the fifth embodiment is applicable to a resin-seal type semiconductor device having a large number of pins.

Figure 7:
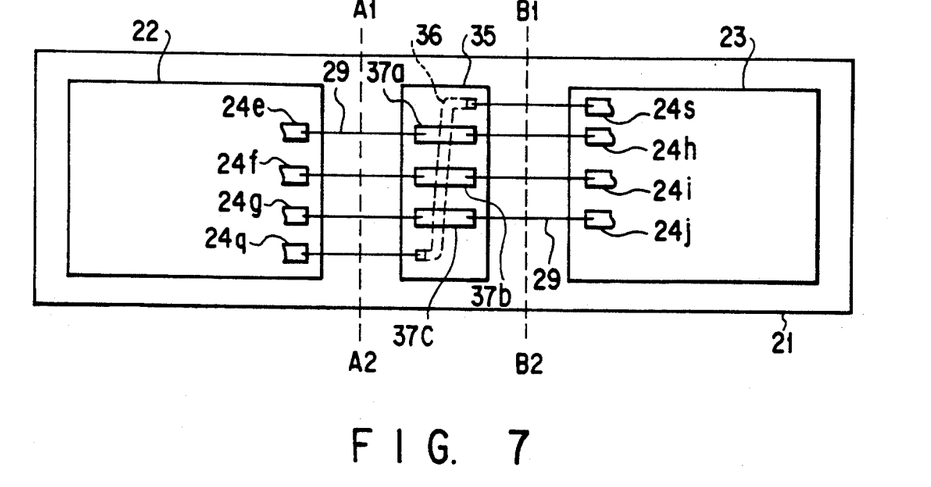
FIG. 7 is a plan view illustrating a manufacturing step of a resin-seal type semiconductor device according to a sixth embodiment of the invention.

FIG. 7 is a plan view illustrating a manufacturing step of a resin-seal type semiconductor device according to a sixth embodiment of the invention. The parts common to those shown in FIG. 1B are denoted by like reference numerals, and only different parts will be described.

A third insulating substrate 35 is provided between the first and second insulating circuit substrates 22 and 23. A multi-layer wiring pattern, e.g. a two-layer wiring pattern is formed on the third insulating substrate 35. Specifically, a first wiring layer 36 is provided on the third insulating substrate 35. An insulating film (not shown) is provided on the first wiring layer 36. Second wiring layers 37a to 37c are formed on the insulating film.

First end portions of wiring patterns 24e to 24g formed on the first insulating circuit substrate 22 are electrically connected to first end portions of the second wiring layers 37a to 37c by means of metal wires 29. Second end portions of the second wiring layers 37a to 37c are electrically connected to first end portions of wiring patterns 24h to 24j provided on the second insulating circuit substrate 23 by means of metal wires 29. A first end portion of the wiring pattern 24q is electrically connected to a first end portion of the first wiring layer 36 by metal wire 29, and a second end portion of the first wiring layer 36 is electrically connected to a first end portion of wiring pattern 24s by metal wire 29.

The same advantage as in the first embodiment can be obtained by the sixth embodiment. In addition, the wiring patterns 24e–24g and 24q provided on the first insulating circuit substrate 22 are electrically connected to the wiring patterns 24h–24j and 24s provided on the second insulating circuit substrate 23 via the first and second wiring layers 36 and 37a–37c. In other words, the wiring patterns 24e–24g and 24q are electrically connected to the wiring patterns 24h–24j and 24s via the multi-layer wiring patterns provided on the third insulating substrate 35. Thus, in the resin-seal type semiconductor apparatus, flexible connection between wiring patterns can be realized.

In addition, if the first and second insulating circuit substrates 22 and 23 and the third insulating substrate 35 are formed of a material with high radiation properties, e.g. a ceramic material such as Al$_2$O$_3$, AlN, or SiC, the allowable power loss can be further increased.

Figure 8A:
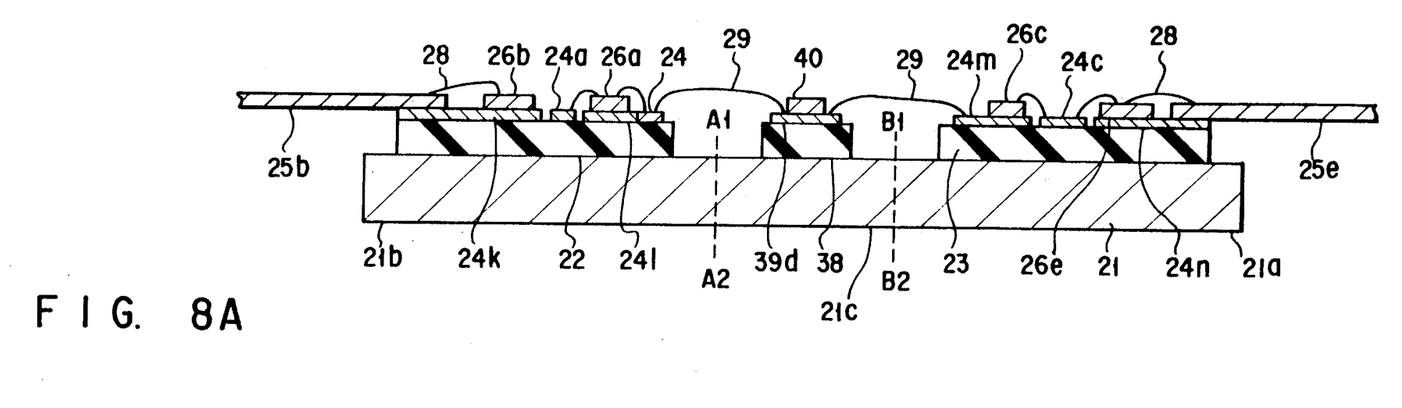
FIG. 8A is a cross-sectional view illustrating a manufacturing step of a resin-seal type semiconductor device according to a seventh embodiment of the invention.
Figure 8B:
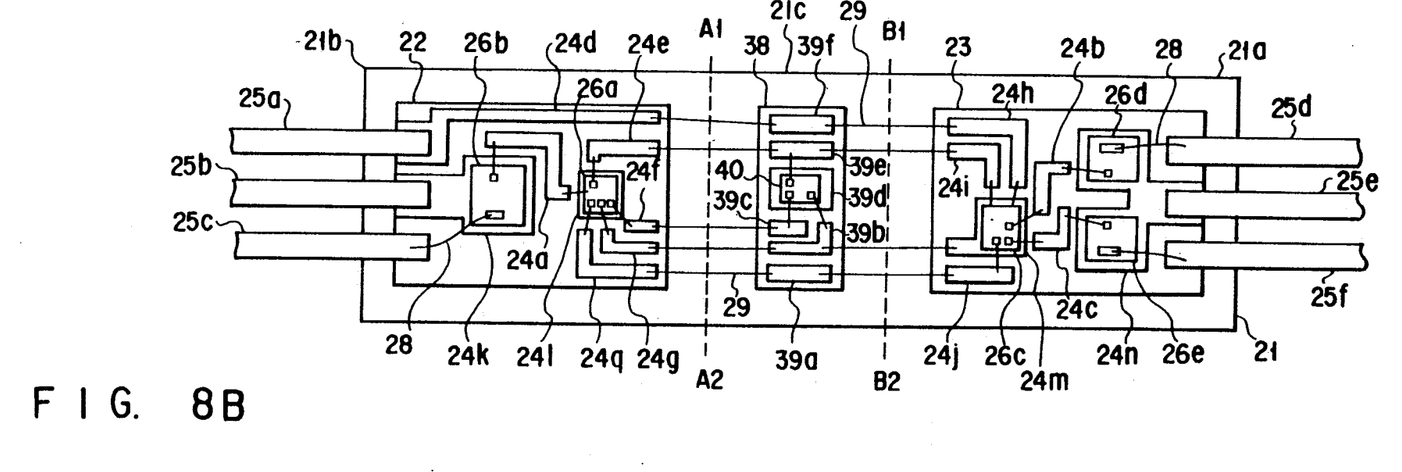
FIG. 8B is a plan view of the semiconductor device shown in FIG. 8A.

FIGS. 8A and 8B are a cross-sectional view and a plan view both illustrating a manufacturing step of a resin-seal type semiconductor device according to a seventh embodiment of the invention. The parts common to those shown in FIGS. 1A and 1B are denoted by like reference numerals, and only different parts will be described.

The third insulating circuit substrate 38 is provided between the first and second insulating circuit substrate 22 and 23 on the metal plate 21. Metal wiring patterns 39a to 39f are provided on the third insulating circuit substrate 38. A semiconductor element 40 is fixed on the wiring pattern 39c by means of solder (not shown).

Specifically, the semiconductor element 40 is electrically connected to the wiring patterns 39b, 39c and 39e by means of bonding wires 28. First end portions of the wiring patterns 24d–24g and 24q on the first insulating circuit substrate 22 are electrically connected to first end portions of the wiring patterns 39a–39c, 39e and 39f on the third insulating circuit substrate 38 by means of metal wires 29. Second end portions of the wiring patterns 39a, 39b, 39e and 39f are electrically connected to first end portions of wiring patterns 24h–24j and 24m on the second insulating circuit substrate 23 by means of metal wires 29.

Thereafter, the metal plate 21 is bent along lines A1–A2 and B1–B2 so as to have a U-shaped cross section. As a result, the second insulating circuit substrate 23 is situated on the inner surface of the upper portion 21a of the metal plate 21 bent to have the U-cross section. The first insulating circuit substrate 22 is situated on the inner surface of the lower portion 21b of the metal plate 21. The third insulating circuit 38 is situated on the inner surface of a coupling portion 21c of the metal plate 21.

The same advantage as in the first embodiment can be obtained by the seventh embodiment. In addition, the third insulating circuit substrate 38 on which the semiconductor element 40 is mounted is provided on the inner surface of the coupling portion 21c of the metal plate 21. Thus, the density of mounted semiconductor elements in the resin-seal type semiconductor device can be further increased.

In addition, if the first to third insulating circuit substrates 22, 23 and 38 are formed of a material with high radiation properties, e.g. a ceramic material such as Al$_2$O$_3$, AlN, or SiC, the allowable power loss can be further increased.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A resin-seal type semiconductor device comprising:
   a main substrate divided into a first surface, a second surface, and a third surface, said first surface and said second surface being positioned opposite to one another and spaced apart by a distance equal to a length of said third surface such that a surface area of said first surface is exactly aligned with a surface area of said second surface and connected thereto via said third surface;
   a first insulating substrate provided on said first surface of said main substrate;
   a second insulating surface provided on said second surface of said main substrate;

first and second semiconductor circuits respectively provided on said first and second insulating substrates, said first and second semiconductor circuits being electrically connected to one another;

first and second outer leads having first end portions thereof respectively provided on said first and second insulating substrates, said first and second outer leads being respectively electrically connected to said first and second semiconductor circuits; and a resin for sealing a gap between said first surface and said second surface of said main substrate, wherein second end portions of said first and second outer leads are exposed from said resin.

2. The resin-seal type semiconductor device according to claim 1, wherein said main substrate is composed of a metallic material.

3. The resin-seal type semiconductor device according to claim 1, wherein said main substrate has holes formed therethrough at a boundary between said first surface and said third surface and at a boundary between said second surface and said third surface.

4. The resin-seal type semiconductor device of claim 1, wherein surfaces of said first and second semiconductor circuits are each coated with a protection material.

5. The resin-seal type semiconductor device according to claim 1, wherein said first and second insulating substrates are each composed of a ceramic material.

6. A resin-seal type semiconductor device comprising:

a main substrate divided into a first surface, a second surface, and a third surface, said first surface and said second surface being positioned opposite to one another and spaced apart by a distance equal to a length of said third surface such that a surface area of said first surface is exactly aligned with a surface area of said second surface and connected thereto via said third surface;

a first insulating substrate provided on said first surface of said main substrate;

the second insulating substrate provided on said second surface of said main substrate;

first and second semiconductor circuits respectively provided on said first and second insulating substrates;

wiring means, provided on said third surface of said main substrate, for electrically connecting said first and second semiconductor circuits to one another;

first and second outer leads having first end portions thereof respectively provided on said first and second insulating substrates, said first and second outer leads being respectively electrically connected to said first and second semiconductor circuits; and a resin for sealing a gap between said first surface and said second surface of said main substrate, wherein second end portions of said first and second outer leads are exposed from said resin.

7. A resin-seal type semiconductor device according to claim 6, further comprising a third semiconductor circuit formed on said third surface of said main substrate, said third semiconductor circuit being electrically connected to said wiring means.

8. A resin-seal type semiconductor device according to claim 6, wherein said main substrate is composed of a metallic material.

9. A resin-seal type semiconductor device according to claim 6, wherein said main substrate has grooves formed therein extending along a boundary between said first surface and said third surface and along a boundary between said second surface and said third surface.

10. A resin-seal type semiconductor device according to claim 6, wherein said main substrate has holes formed therethrough at a boundary portion between said first surface and said third surface and at a boundary portion between said second surface and said third surface.

11. A resin-seal type semiconductor device according to claim 6, wherein surfaces of said first and second semiconductor circuits are each coated with a protection material.

12. A resin-seal type semiconductor device according to claim 6, wherein said first and second insulating substrates are each formed of a ceramic material.

13. A resin-seal type semiconductor device comprising:

a main substrate divided into a first surface, a second surface, and a third surface, said first surface and said second surface being positioned opposite to one another and spaced apart by a distance equal to a length of said third surface such that a surface area of said first surface is exactly aligned with a surface area of said second surface and connected thereto via said third surface;

a first insulating substrate provided on said first surface of said main substrate;

a second insulating substrate provided on said second surface of said main substrate;

first and second semiconductor circuits respectively provided on said first and second insulating substrates, said first and second semiconductor circuits being electrically connected to one another;

first and second outer leads having first end portions thereof respectively provided on said first and second insulating substrates, said first and second outer leads being respectively electrically connected to said first and second semiconductor circuits; and a resin for sealing a gap between said first surface and said second surface of said main substrate, wherein second end portions of said first and second outer leads are exposed from said resin and wherein said main substrate has grooves formed therein which extend along a boundary between said first surface and said third surface and along a boundary between said second surface and said third surface.

14. A resin-seal type semiconductor device comprising:

a main substrate divided into a first surface, a second surface, and a third surface, said first surface and said second surface being positioned opposite to one another and spaced apart by a distance equal to a length of said third surface such that a surface area of said first surface is exactly aligned with a surface area of said second surface and connected thereto via said third surface;

a first insulating substrate provided on said first surface of said main substrate;

a second insulating substrate provided on said second surface of said main substrate;

first and second semiconductor chips respectively provided on said first and second insulating substrates, said first and second semiconductor chips being electrically connected to one another;

a third semiconductor chip formed on said third surface of said main substrate;

first and second outer leads having first end portions thereof respectively provided on said first and second insulating substrates, said first and second outer leads being respectively electrically connected to said first and second semiconductor chips; and a resin layer for sealing a gap between said first surface and said second surface of said main substrate, wherein second end portions of said first and second outer leads are exposed from said resin.

15. A resin-seal type semiconductor device comprising:

a main substrate divided into a first surface, a second surface, and a third surface, said first surface and said second surface being positioned opposite to one another and spaced apart by a distance equal to a length of said third surface such that a surface area of said first surface is exactly aligned with a surface area of said second surface and connected thereto via said third surface;

a first insulating substrate provided on said first surface of said main substrate;

a second insulating substrate provided on said second surface of said main substrate;

first and second semiconductor chips respectively provided on said first and second insulating substrates, said first and second semiconductor chips being electrically connected to one another;

first and second outer leads having first end portions thereof respectfully provided on said first and second insulating substrates, said first and second outer leads being respectively electrically connected to said first and second semiconductor chips; and a resin layer for sealing a gap between said first surface and said second surface of said main substrate, wherein second end portions of said first and second outer leads are exposed from said resin and wherein said third surface of said main substrate is formed by bending said main substrate to form said first surface and said second surface.

16. A resin-seal type semiconductor device comprising:

a U-shaped main substrate having a first surface, a second surface, and a third surface, said first surface and said second surface being positioned opposite to one another and spaced apart by a distance equal to a length of said third surface such that a surface area of said first surface is exactly aligned with a surface area of said second surface and connected thereto via said third surface, said first surface, said second surface, and said third surface together defining a space therewithin;

a first insulating substrate provided on said first surface of said U-shaped main substrate;

a second insulating substrate provided on said second surface of said U-shaped main substrate;

first and second semiconductor chips respectively provided on said first and second insulating substrates, said first and second semiconductor chips being electrically connected to one another;

first and second outer leads having first end portions thereof respectively provided on said first and second insulating substrates, said first and second outer leads being respectively electrically connected to said first and second semiconductor chips; and a resin layer for filling said space defined by said first surface, said second surface, and said third surface, wherein second end portions of said first and second outer leads are exposed from said resin layer.

17. A resin-type semiconductor device according to claim 16, wherein an outer surface of said U-shaped main substrate is not coated with said resin layer.

18. A resin-seal type semiconductor device according to claim 16, wherein an outer surface of said U-shaped main substrate is coated with said resin layer.

19. A resin-seal type semiconductor device according to claim 16, wherein said U-shaped main substrate is composed of a metallic material.

20. A resin-seal type semiconductor device according to claim 16, wherein said U-shaped main substrate has recessed portions formed therein which extend along a first boundary between said first surface and said third surface, and along a second boundary between said second surface and said third surface.

21. A resin-seal type semiconductor device according to claim 16, wherein said U-shaped main substrate has holes formed therethrough at a first boundary between said first surface and said third surface and at a second boundary between said second surface and said third surface.

22. A resin-seal type semiconductor device comprising:

a metallic U-shaped substrate having a first surface, a second surface, and a third surface, said first surface and said second surface being positioned opposite to one another and spaced apart by a distance equal to a length of said third surface such that a surface area of said first surface is exactly aligned with a surface area of said second surface and connected thereto via said third surface, wherein said first surface, said second surface, and said third surface together define a space therewithin;

a first insulating substrate provided on said first surface of said metallic U-shaped substrate;

a second insulating substrate provided on said second surface of said metallic U-shaped substrate;

first and second semiconductor chips respectively provided on said first and second insulating substrates;

connecting means, provided on said third surface of said metallic U-shaped substrate, for electrically connecting said first and second semiconductor chips to one another;

first and second outer leads having first end portions thereof respectively provided on said first and second insulating substrates, said first and second outer leads being respectively electrically connected to said first and second semiconductor chips; and a resin layer for filling said space defined by said first surface, said second, and said third surface of said metallic U-shaped substrate, wherein second end portions of said first and second outer leads are exposed from said resin layer.

23. A resin-seal type semiconductor device according to claim 22, further comprising a third semiconductor chip formed on said third surface of said metallic U-shaped substrate, said third semiconductor chip being electrically connected to said connecting means.

* * * * *